(12) United States Patent
Schneider et al.

(10) Patent No.: US 6,813,217 B2
(45) Date of Patent: Nov. 2, 2004

(54) INTEGRATED MEMORY HAVING AN ACCELERATED WRITE CYCLE

(75) Inventors: Helmut Schneider, München (DE); Ioannis Chrissostomidis, München (DE); Albert Keyserlingk, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/444,542

(22) Filed: May 23, 2003

(65) Prior Publication Data

US 2003/0218933 A1 Nov. 27, 2003

(30) Foreign Application Priority Data

May 23, 2002 (DE) .......................................... 102 22 892

(51) Int. Cl.⁷ ................................................. G11C 8/00
(52) U.S. Cl. ....................................... 365/233; 365/194
(58) Field of Search ........................... 365/233, 189.12, 365/194, 189.04

(56) References Cited

U.S. PATENT DOCUMENTS 6,275,086 B1 * 8/2001 Douchi et al. .............. 365/233
6,316,979 B1   11/2001 Keeth
6,339,552 B1 * 1/2002 Taruishi et al. ........ 365/189.05
2001/0004335 A1   6/2001 Murakami

* cited by examiner

*Primary Examiner*—Thong Q. Le
(74) *Attorney, Agent, or Firm*—Laurence A. Greenberg; Werner H. Stemer; Gregory L. Mayback

(57) ABSTRACT

An integrated memory has a respective terminal for a clock signal and a data clock signal and also a data terminal. For a write operation, the memory accepts a write command on account of the clock signal and, in a manner time-delayed with respect thereto, a plurality of data at the data terminal on account of the data clock signal. An access controller serves for controlling an access to a memory cell array of the memory for the parallel writing of the accepted data to selected memory cells. The access to the memory cell array is triggered by the access controller by a phase-shifted clock signal before the clock signal has a next rising edge after the acceptance of the data. It is thus possible to increase the effective writing time from the application of the write command to the closing of a memory bank by a precharge command.

3 Claims, 2 Drawing Sheets

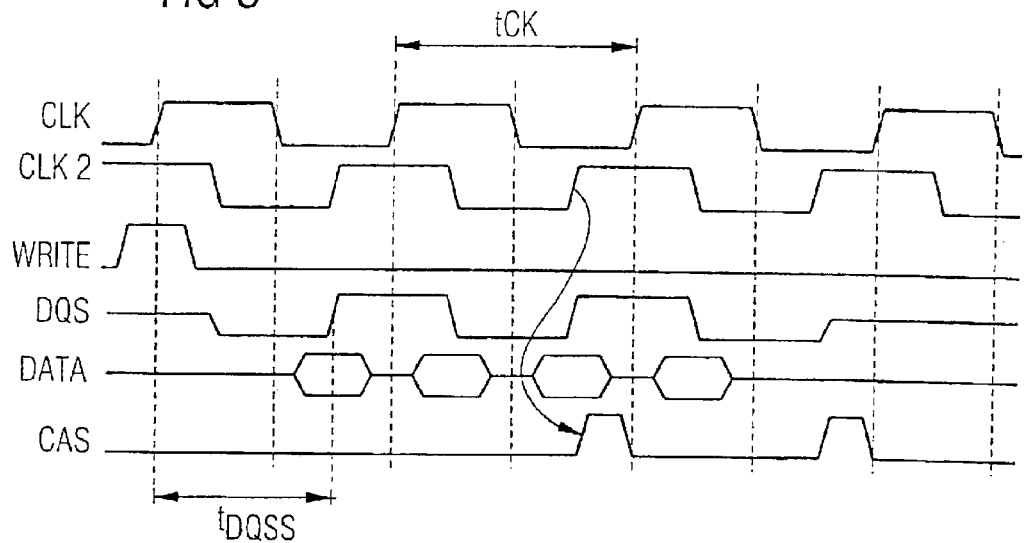
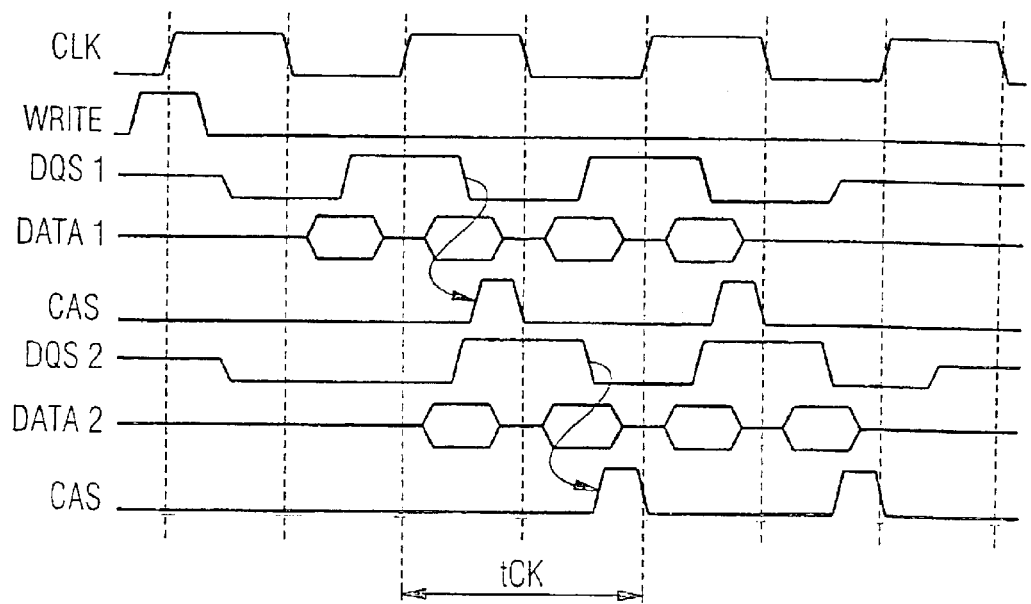

INTEGRATED MEMORY HAVING AN ACCELERATED WRITE CYCLE

BACKGROUND OF THE INVENTION

Field of the Invention

The present invention relates to an integrated memory having a respective terminal for a clock signal and a data clock signal and also having a data terminal, in which, for a write operation, the memory accepts a write command on account of the clock signal and, in a manner time-delayed with respect thereto, a plurality of data at the data terminal on account of the data clock signal. The memory also has an access controller for controlling an access to a memory cell array of the memory for the parallel writing of the accepted data to selected memory cells.

Integrated memories such as, for example, known DRAMs in a so-called double data rate architecture (DDR DRAMs) have comparatively high switching and access speeds. Such integrated memories generally have, in addition to a clock signal which is usually supplied externally, a terminal for a data reference signal or a data clock signal ("data strobe"), which is present for the read-out or writing of data of the integrated memory at an external terminal. The data strobe signal is accepted by the integrated memory during a write access together with data signals to be written and serves as a reference signal for the acceptance of the data to be written.

In normal operation of the memory, by way of example, a controller is connected to the data terminal for the inputting of data and to the terminal of the data clock signal. A write access to the memory by the controller is controlled by the data clock signal in this case. In particular, the data clock signal indicates to the memory the point in time at which data to be written are intended to be accepted into the memory.

In present-day DDR SDRAMs, a so-called write latency is provided for the inputting of the write data in order that the data can be input serially at double the clock frequency, buffer-stored and written to the memory core at a single clock frequency. Usually, a write command is detected with the rising edge of the clock signal, while the data are accepted with the rising and falling edges of the data clock signal (which has a period duration identical to that of the clock signal). In this case, the specification generally stipulates that the delay time between the write command, which is accepted with the rising clock edge, and the first data packet, which is accepted with the rising edge of the data clock signal, is between 0.75 times and 1.25 times the clock period of the clock signal. Therefore, a complete data pair is available after the falling edge of the data clock signal and thus after at the earliest 1.25 times and at the latest 1.75 times the clock period of the clock signal after the acceptance of the write command.

As in the so-called single data rate SDRAM, the access to a memory cell array in the memory core and thus the internal write operation for writing the accepted data is triggered by a rising edge of the clock signal. The two data packets that are accepted serially with the rising and falling edges of the data clock signal are written to the memory cell array in parallel. On account of the triggering of the internal write operation by the clock signal, the data pairs have to be buffer-stored for a time interval of 0.25 times to 0.75 times the clock period of the clock signal.

SUMMARY OF THE INVENTION

It is accordingly an object of the invention to provide an integrated memory which overcomes the above-mentioned disadvantages of the prior art devices of this general type, in which it is possible to increase the effective time period for a write operation from the application of the write command to the closing of the relevant memory bank by a precharge command with a minimum predetermined time between the last write datum and the precharge command.

With the foregoing and other objects in view there is provided, in accordance with the invention, an integrated memory. The integrated memory has a first terminal for a clock signal, a second terminal for a data clock signal, and a data terminal. For a write operation, the memory accepts a write command on account of the clock signal and, in a manner time-delayed with respect thereto, a plurality of data at the data terminal on account of the data clock signal. A memory cell array having memory cells is coupled to the data terminal. An access controller is coupled to the memory cell array for controlling an access to the memory cell array for the parallel writing of accepted data to selected ones of the memory cells. Access to the memory cell array is triggered by the access controller before the clock signal has a next rising edge after an acceptance of the data. In addition, the access controller has a control input. A phase shifter circuit has an output and is coupled to the first terminal for receiving the clock signal. The phase shifter circuit generates at the output a second clock signal, the second clock signal is negatively phase-shifted relative to the clock signal. The output is connected to the control input of the access controller. Access to the memory cell array is triggered by the access controller on account of the second clock signal.

In the memory according to the invention, access to the memory cell array is triggered by the access controller before the clock signal has a next rising edge after the acceptance of the data. The earlier availability of the data to be written is thus utilized in order to write the data earlier to the memory cell array of the memory. The principle of triggering the write access to the memory core and thus the internal write operation by a rising edge of the clock signal is abandoned and, by contrast, the access to the memory cell array is triggered by the access controller before the clock signal has a next rising edge after the acceptance of the data. It is thus possible to increase the effective writing time from the application of the write command to the closing of a memory bank by a precharge command with a minimum time between the last write datum and the precharge command. This creates a prerequisite for ensuring the performance of the memory even at higher frequencies with decreasing write cycle times.

The memory has a phase shifter circuit, which receives the clock signal and generates at an output a second clock signal, which is negative phase-shifted relative to the clock signal. The output of the phase shifter circuit is connected to a control input of the access controller. The access to the memory cell array is triggered by the access controller on account of the second clock signal.

In accordance with an added feature of the invention, the data at the data terminal are accepted by the memory in each case with a rising and a subsequent falling edge of the data clock signal and the access to the memory cell array is triggered by the access controller on account of a next rising edge of the second clock signal after the acceptance of the data.

In accordance with a further feature of the invention, a triggering edge of the data clock signal for the acceptance of a first datum is delayed relative to a triggering edge of the clock signal for an acceptance of the write command by a time period corresponding to 0.75 times to 1.25 times a clock period of the clock signal. The phase shifter circuit advances on the second clock signal relative to the clock signal by a phase corresponding to 0.25 times the clock period of the clock signal.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a signal diagram showing a write operation with respect to the exemplary embodiment of a memory according to the invention in accordance with FIG. 2A; and FIG. 4 is a signal diagram for a write operation of a memory in accordance with FIG. 2B.

DESCRIPTION OF THE PREFERRED EMBODIMENTS

In the figures, identical or mutually corresponding components and signals are provided with identical reference symbols.

Figure 1:
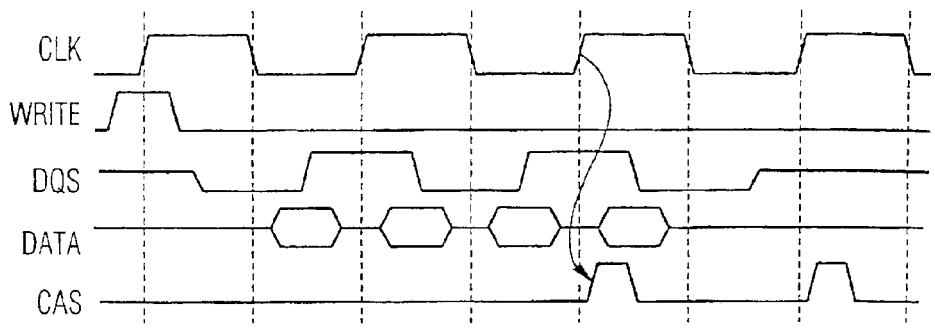
FIG. 1 is a signal diagram for a write operation of a DDR DRAM according to the prior art.

Referring now to the figures of the drawing in detail and first, particularly, to FIG. 1 thereof, there is shown a write operation of a DDR DRAM according to the prior art. The write command WRITE is detected with a rising edge of a clock signal CLK, while data DATA are accepted into the memory with the rising and falling edges of a data clock signal DQS. In accordance with the specification, the delay between the acceptance of the write command WRITE upon the rising clock edge of the clock signal CLK and the acceptance of the first data packet upon the rising edge of the data clock signal DQS must be between 0.75 times and 1.25 times the clock period of the clock signal CLK. Thus, a complete data pair is available for further processing after the falling edge of the data clock signal DQS and hence after at the earliest 1.25 times and at the latest 1.75 times the clock period of the clock signal CLK after the acceptance of the write command WRITE.

As in the case of an SDRAM, the access to the memory core and thus the internal write operation is controlled by the next rising edge of the clock signal CLK. In other words, the column access signal CAS is activated with the next rising edge of the clock signal CLK after the acceptance of a data pair. The data pairs accordingly have to be buffer-stored for a time interval of 0.25 times to 0.75 times the clock period of the clock signal CLK. In the present example in accordance with FIG. 1, the delay between the acceptance of the write command WRITE and acceptance of the first data packet is 0.75 times the clock period. The second data packet thus has to be buffer-stored for a time corresponding to 0.75 times the clock period before the data packets can be written in parallel to selected memory cells of the memory upon the rising edge of the clock signal CLK.

Figure 2A:
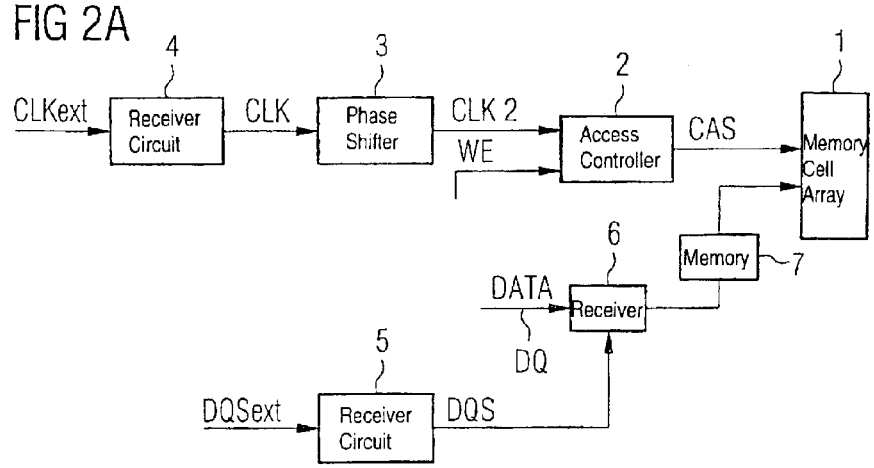
FIGS. 2A and 2B are block diagrams of two embodiments of a DDR DRAM according to the invention.

FIG. 2A illustrates an embodiment of a DDR DRAM according to the invention. An access controller 2 serves for controlling an access to a memory cell array 1 of the memory by a column access signal CAS. A phase shifter circuit 3 receives the clock signal CLK and generates a second clock signal CLK2 at an output. The clock signal CLK2 is negatively phase-shifted relative to the clock signal CLK (in this respect, also see FIG. 3). The output of the phase shifter circuit 3 is connected to a control input of the access controller 2. The clock signal CLK can be tapped off at the output of a receiver circuit 4, to which an external clock signal CLKext is fed. A data clock signal DQSext is correspondingly fed to a receiver circuit 5, it being possible to tap off the internal data clock signal DQS at an output of the receiver circuit 5. Data DATA are present at a data terminal DQ and are accepted into the memory via the receiver circuit 6 on account of the data clock signal DQS. The data are accepted from the data terminal DQ in each case with a rising and a subsequent falling edge of the data clock signal DQS and at least the first data packet is buffer-stored in the memory circuit 7 before the data packets are written to the memory cell array 1 in parallel.

FIG. 3 shows an exemplary signal diagram with respect to the exemplary embodiment of the memory in accordance with FIG. 2A. As already shown for a conventional memory with reference to FIG. 1, for the write operation, the memory accepts the write command WRITE on account of the rising edge of the clock signal CLK and, in a manner time-delayed with respect thereto, the individual data packets DATA at the data terminal DQ in each case with a rising and a subsequent falling edge of the data clock signal DQS. The access to the memory cell array for the parallel writing of the accepted data to selected memory cells is triggered by the access controller 2 on account of a next rising edge of the advanced-on clock signal CLK2 after the acceptance of the data. Thus, the earlier availability of the write data is utilized in order to advance the signal CAS for writing the data to the memory core. Thus, the access to the memory cell array 1 is triggered before the clock signal CLK has a next rising edge after the acceptance of the data. It is thus possible to increase the effective writing time through to the closing of a memory bank by a precharge command.

In accordance with the specification, a triggering edge of the data clock signal for the acceptance of a first data packet must be delayed relative to a triggering edge of the clock signal for the acceptance of the write command by a time period corresponding to 0.75 times to 1.25 times the clock period tCK of the clock signal CLK. The delay time is usually designated as tDQSS. The phase shift of the second clock signal CLK2 must be set by the phase shifter circuit 3 such that the data are still reliably accepted with a maximum tDQSS. Accordingly, the second clock signal CLK2 is advanced relative to the clock signal CLK by the phase shifter circuit 3 by a phase corresponding to 0.25 times the clock period tCK. The following generally holds true in this case for the phase shift:

$$\Delta = 2tCK - (tDQSS\text{max} + 0.5\ tCK).$$

Figure 2B:
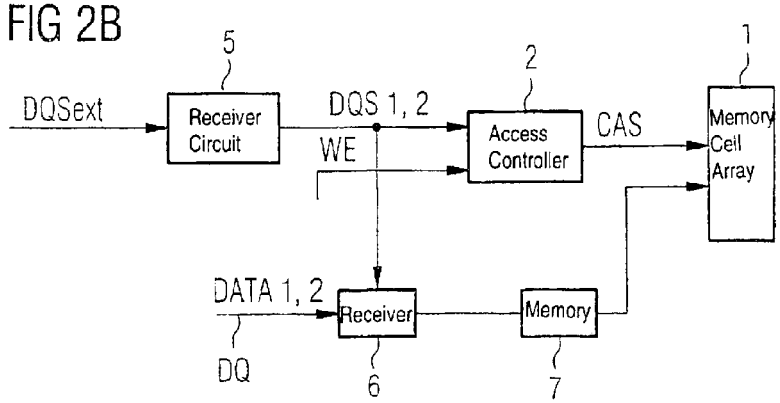

FIG. 2B illustrates another embodiment of the DDR DRAM. In a departure from the memory in accordance with FIG. 2A, the terminal for the data clock signal DQS is connected to the control input of the access controller 2. A signal WE represents an activation signal which indicates a write operation to the access controller 2. In the case of the memory in accordance with FIG. 2B, an access to the memory cell array 1 is triggered by the access controller 2 on account of the data clock signal DQS.

FIG. 4 shows a signal diagram with respect to the exemplary embodiment of the memory in accordance with FIG. 2B. The memory accepts the individual data DATA1 and DATA2, respectively, at the data terminal DQ in each case with a rising and a subsequent falling edge of the data clock signal DQS1 and DQS2, respectively. The access to the memory cell array 1 is triggered by the access controller 2 on account of the falling edge of the data clock signal DQS1 and DQS2, respectively. The time tDQSS in this case corresponds to 0.75 tCK for the signals DQS1 and DATA1, and to 1.25 tCK for the signals DQS2 and DATA2.

The memory in accordance with FIG. 2A has the advantage that the CAS timing relative to the clock signal CLK and thus the CAS cycle time are constant. However, additional circuitry outlay is necessary in the form of the phase shifter circuit that is required. The latter must be able to ensure the negative phase shift under all operating conditions and at any frequency in order that the synchronization of the two time domains of the clock signal CLK and data clock signal DQS functions reliably.

The memory in accordance with FIG. 2B is less complicated in terms of the circuitry outlay since the data are transported from the inputs to the memory core completely in the DQS domain. However, successive DQS edges may be related differently to the clock signal CLK, i.e. have different timings with respect thereto, with the result that relatively short write cycles may arise under certain circumstances.

We claim:

1. An integrated memory, comprising:
   a first terminal for a clock signal;
   a second terminal for a data clock signal;
   a data terminal, and for a write operation, the memory accepting a write command on account of the clock signal and, in a manner time-delayed with a maximum delay time with respect thereto, a plurality of data at said data terminal on account of the data clock signal;
   a memory cell array having memory cells and coupled to said data terminal;
   an access controller coupled to said memory cell array for controlling an access to said memory cell array for the parallel writing of accepted data to selected ones of said memory cells, access to said memory cell array being triggered by said access controller before the clock signal has a next rising edge after an acceptance of the data, said access controller having a control input; and
   a phase shifter circuit having an output and coupled to said first terminal for receiving the clock signal, said phase shifter circuit generating at said output a second clock signal, the second clock signal being negatively phase-shifted relative to the clock signal by a phase shift, the phase shift being set by said phase shifter circuit such that the data are still reliably accepted with the maximum time delay, said output connected to said control input of said access controller, access to said memory cell array being triggered by said access controller on account of the second clock signal.

2. The integrated memory according to claim 1, wherein the data at said data terminal are accepted by the memory in each case with a rising and a subsequent falling edge of the data clock signal and the access to said memory cell array is triggered by said access controller on account of a next rising edge of the second clock signal after the acceptance of the data.

3. The integrated memory according to claim 2, wherein:
   a triggering edge of the data clock signal for the acceptance of a first datum is delayed relative to a triggering edge of the clock signal for an acceptance of the write command by a time period corresponding to 0.75 times to 1.25 times a clock period of the clock signal; and
   said phase shifter circuit advances on the second clock signal relative to the clock signal by a phase corresponding to 0.25 times the clock period of the clock signal.

* * * * *